(12) United States Patent
Kamiya et al.

(10) Patent No.: US 9,966,092 B2
(45) Date of Patent: May 8, 2018

(54) ION BEAM ETCHING METHOD AND ION BEAM ETCHING APPARATUS

(71) Applicant: CANON ANELVA CORPORATION, Kawasaki-shi (JP)

(72) Inventors: Yasushi Kamiya, Kawasaki (JP); Hiroshi Akasaka, Kawasaki (JP); Kiyotaka Sakamoto, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days. days.

(21) Appl. No.: 15/366,732

(22) Filed: Dec. 1, 2016

(65) Prior Publication Data
US 2017/0098458 A1   Apr. 6, 2017

Related U.S. Application Data

(63) Continuation of application No. PCT/JP2015/005045, filed on Oct. 2, 2015.

(51) Int. Cl.
*C23C 14/00* (2006.01)
*G11B 5/31* (2006.01)
*H01J 37/32* (2006.01)

(52) U.S. Cl.
CPC ...... *G11B 5/3163* (2013.01); *H01J 37/32422* (2013.01); *H01J 2237/08* (2013.01)

(58) Field of Classification Search
CPC .................................................. H01J 37/302
USPC ..................................... 204/192.34
See application file for complete search history.

(56) References Cited

U.S. PATENT DOCUMENTS

| | | | |
|---|---|---|---|
| 5,868,952 A | 2/1999 | Hatakeyama et al. | |
| 5,894,058 A | 4/1999 | Hatakeyama et al. | |
| 6,007,969 A | 12/1999 | Hatakeyama et al. | |
| 6,010,831 A | 1/2000 | Hatakeyama et al. | |
| 6,015,976 A | 1/2000 | Hatakeyama et al. | |
| 6,048,671 A | 4/2000 | Hatakeyama et al. | |
| 9,312,102 B2 | 4/2016 | Kamiya et al. | |
| 2008/0110745 A1 | 5/2008 | Mai et al. | |
| 2012/0145535 A1* | 6/2012 | Kamiya | H01J 37/302 |
| | | | 204/192.34 |

(Continued)

FOREIGN PATENT DOCUMENTS

| | | |
|---|---|---|
| JP | 8-264511 A | 10/1996 |
| JP | 2002-158211 A | 5/2002 |

(Continued)

OTHER PUBLICATIONS

Notification of Refusal Reason in Japanese Application No. 2016-517569 (dated Oct. 18, 2016).

(Continued)

*Primary Examiner* — Timon Wanga
(74) *Attorney, Agent, or Firm* — Fitzpatrick, Cella, Harper & Scinto

(57) ABSTRACT

To provide an ion beam etching method which enables a highly uniform IBE process even under a low-angle-incident static condition, without increase in the size of an apparatus. The ion beam etching method includes: changing a position of an opening portion with respect to a substrate; etching the substrate with an ion beam passing through the opening portion; and reducing a tilt angle as a center of a site where the ion beam is incident on the substrate moves away from the ion source.

5 Claims, 13 Drawing Sheets

(56) References Cited

U.S. PATENT DOCUMENTS

| | | | |
|---|---|---|---|
| 2013/0206583 A1 | 8/2013 | Druz et al. | |
| 2015/0303028 A1 | 10/2015 | Kamiya et al. | |
| 2016/0189925 A1 | 6/2016 | Kamiya et al. | |

FOREIGN PATENT DOCUMENTS

| | | |
|---|---|---|
| JP | 2010-056586 A | 3/2010 |
| JP | 2012-129224 A | 7/2012 |
| JP | 2012-142398 A | 7/2012 |
| NO | 2015/060047 A1 | 4/2015 |

OTHER PUBLICATIONS

Notice of Preliminary Rejection in Korean Application No. 10-2016-7036137 (Feb. 19, 2018).

\* cited by examiner

IB: ION BEAM

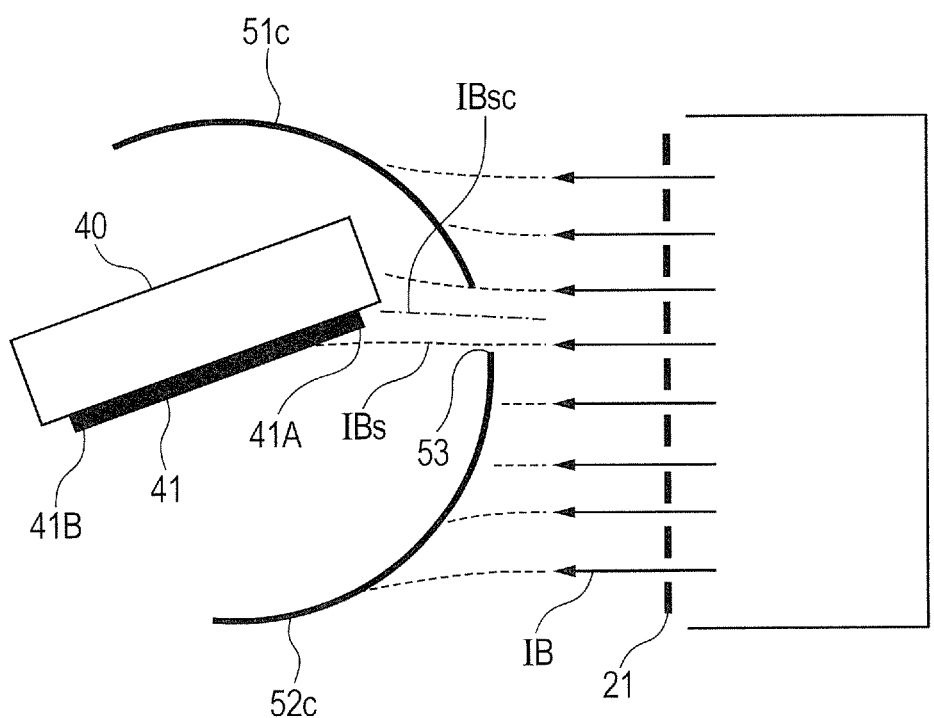

SLIT POSITION B

WITHOUT ADJUSTMENT

AFTER ADJUSTMENT

WITHOUT SHUTTER SCAN

WITH SHUTTER SCAN

SiO2 E.R. : 1.24 A/s
Y-R/M : 4.5%
WITHOUT SHUTTER SCAN

SiO2 E.R. : 0.47 A/s
Y-R/M : 2.7%
WITH SHUTTER SCAN

ION BEAM ETCHING METHOD AND ION BEAM ETCHING APPARATUS

CROSS-REFERENCES TO RELATED APPLICATIONS

This application is a continuation application of International Application No. PCT/JP2015/005045, filed Oct. 2, 2015. The contents of the aforementioned applications are incorporated herein by reference in their entireties.

TECHNICAL FIELD

The present invention relates to an ion beam etching method and an ion beam etching apparatus.

BACKGROUND ART

An ion beam etching (hereinafter, also referred to as IBE) process has been used, for example, in multiple steps in production of magnetic sensors used for hard disk drives, which are magnetic recording media. Shapes of magnetic head elements of a magnetic sensor are three-dimensional structures. The shapes of the elements provided in a substrate surface after the etching process have to be highly uniform. To make the shapes of the element uniform, the etching process is performed with the substrate being rotated when the shapes of the elements are mirror symmetric, whereas the etching process is performed with the substrate fixed in any direction when the shapes of the elements are not mirror symmetric. Elements with non-mirror symmetric shapes can be formed by utilizing the facts that the shapes of the elements obtained after the etching are determined by the incident angle of the ion beam on the substrate surface, and that the incident angle of the ion beam is determined by the substrate tilt angle during the process.

To form elements with asymmetric shapes in a step of producing magnetic heads, a substrate held static may be processed with a relatively low incident angle of about 20 degrees in some cases (hereinafter, this condition is referred to as a low-angle-incident static condition). When the IBE process is performed on a substrate held static, the shapes of the elements may be nonuniform within the substrate surface. This nonuniformity is attributable to the fact that when a substrate is tilted in an in-plane direction, the distance from the ion source varies depending on the position on the substrate surface, and hence the incident angle of an ion beam emitted from the ion source varies depending on the position on the substrate surface. This nonuniformity is also attributable to the angle of deviation of the ion beam due to the plasma density distribution inside the ion source.

The nonuniformity in the substrate surface under the low-angle-incident static condition also depends on the energy of the ion beam. Especially, an ion beam of an acceleration voltage of 400 V or higher enables a highly uniform process even under the low-angle-incident static condition, because such an ion beam has a high moving speed of the ions and hence has a high rectilinearity of the ions. However, with an ion beam of an acceleration voltage of less than 400 V, the etching amounts and the shapes of the elements in the substrate surface under the low-angle-incident static condition become nonuniform, because the moving speed is low and the path of the ions is deviated.

Apparatuses have been proposed for obtaining elements with uniform shapes in a substrate surface. An IBE apparatus of Patent Document 1 scans a substrate surface with a spot-shaped ion beam by two-dimensionally moving an ion source with a small aperture diameter and a substrate. An IBE apparatus of Patent Document 2 scans a substrate surface with a slit-shaped ion beam by moving a substrate in a direction perpendicular to a long axis of a rectangular ion source. In this IBE apparatus, a flat-plate shutter for forming the slit-shaped ion beam is provided between the ion source and the substrate to control the incident angle of the ion beam on the substrate surface with respect to the moving direction of the substrate.

CITATION LIST

Patent Documents

Patent Document 1: United States Patent Application Publication No. 2008/110745
Patent Document 2: United States Patent Application Publication No. 2013/206583

SUMMARY OF INVENTION

Technical Problem

The IBE apparatus of Patent Document 1, which uses the ion source with a small aperture diameter, has a small etching area, and is capable of finely controlling the etching area for each irradiation area with the ion beam. However, the IBE apparatus of Patent Document 1 takes long time to perform an etching process on the entire surface of a substrate. For this reason, the time required to process a single substrate increases with the increase in size of the substrate. In addition, since a substrate is scanned in a two-dimensional plane, the size of the apparatus increases. The IBE apparatus of Patent Document 2, which uses the rectangular ion source, is capable of simultaneously processing a larger area and requires a shorter process time than the apparatus of Patent Document 1. However, since the substrate is moved linearly, the size of the apparatus enlarges.

The present invention has been made to solve the above-described problems, and an object of the present invention is to provide an ion beam etching method and an ion beam etching apparatus which enable a highly uniform IBE process even under a low-angle-incident static condition, without enlarging in the size of the apparatus.

Solution to Problem

An ion beam etching method according to the present invention is an ion beam etching method performed in an ion beam etching apparatus including an ion source that emits an ion beam to a substrate, a substrate holder that holds the substrate and changes a tilt angle of the substrate with respect to the ion source, and a shutter that has an opening portion through which the ion beam passes and is capable of changing a position of the opening portion with respect to the substrate, the method comprising: changing the position of the opening portion with respect to the substrate; etching the substrate with the ion beam passing through the opening portion; and reducing the tilt angle as a center of a site where the ion beam is incident on the substrate moves away from the ion source.

An ion beam etching apparatus according to the present invention is an ion etching apparatus including: an ion source that emits an ion beam to a substrate; a substrate holder that holds the substrate and changes a tilt angle of the substrate with respect to the ion source; a shutter that has an opening portion through which the ion beam passes and is capable of changing a position of the opening portion with respect to the substrate; a position control unit that changes the position of the opening portion with respect to the substrate; an etching control unit that etches the substrate with the ion beam passing through the opening portion; and a tilt angle control unit that reduces the tilt angle as a center of a site where the ion beam is incident on the substrate moves away from the ion source.

Advantageous Effects of Invention

According to the present invention, the tilt angle of the substrate is reduced as the center of the site where the ion beam is incident on the substrate moves away from the ion source, and hence the incident angle of the ion beam on a substrate can be uniform on either the side near the ion source or the side distant from the ion source. Hence, the shapes of elements formed in the substrate can be made highly uniform. This enables a highly uniform etching process under a low-angle-incident static condition without increase in the size of the apparatus. In addition, the decrease in the nonuniformity of the shapes of the elements formed on the substrate makes it possible to improve the yield of finished products.

BRIEF DESCRIPTION OF DRAWINGS

FIGS. 2A and 2B are schematic diagrams of an ion beam etching process in the ion beam etching apparatus according to the embodiment of the present invention.

DESCRIPTION OF EMBODIMENTS

Hereinafter, an embodiment of the present invention is described with reference to the drawings. Note that members, arrangements, and the like described below are examples in which the invention is embodied; hence, the present invention is not limited thereto, but, as a matter of course, can be modified in various manners within the gist of the present invention.

Figure 1A:
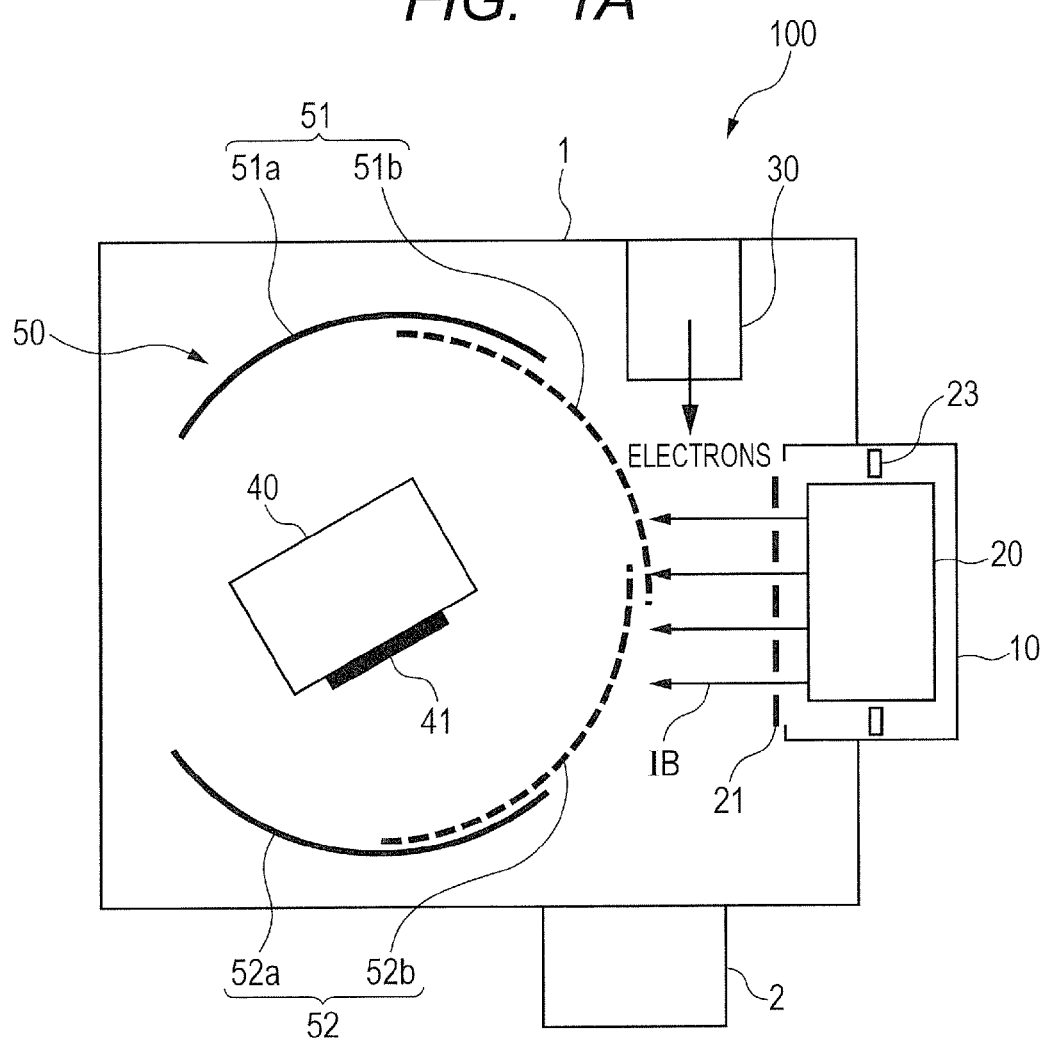
FIGS. 1A, 1B and 1C are schematic diagrams of an ion beam etching apparatus according to an embodiment of the present invention.
Figure 1B:
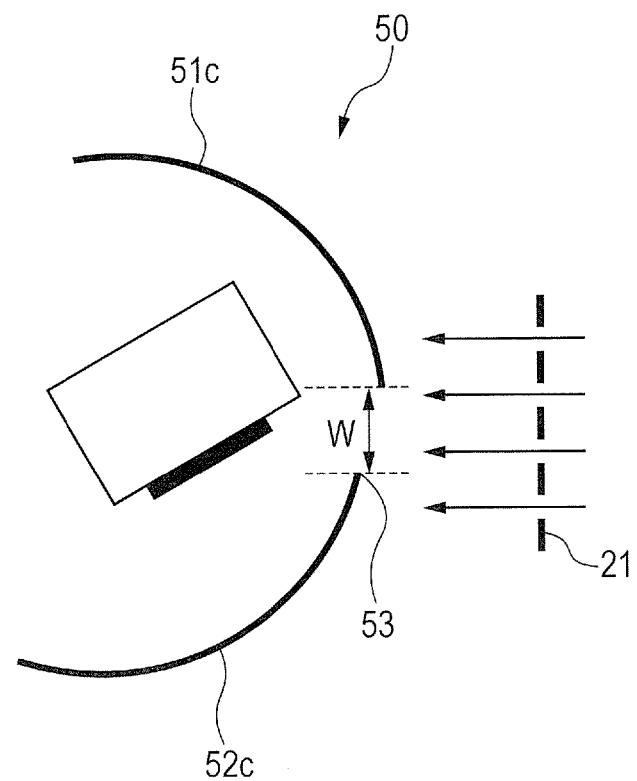
Figure 1C:
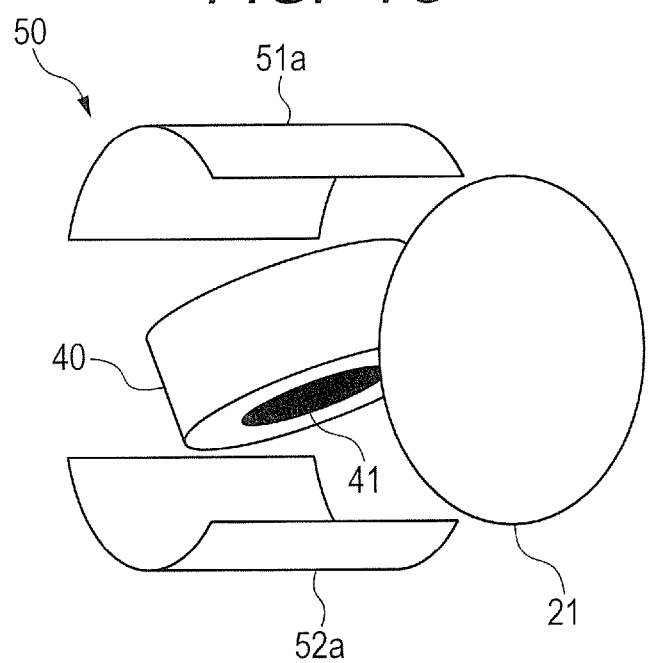

FIGS. 1A to 1C are schematic diagrams of an IBE apparatus 100, where FIG. 1A is a schematic diagram of the IBE apparatus 100, FIG. 1B is a schematic diagram of a shutter device 50, and FIG. 1C is a perspective diagram of the shutter device 50. The IBE apparatus 100 includes a vacuum container 1, an exhaust device 2, an ion source 10, a neutralizer 30, a substrate holder 40, and the shutter device 50. The ion source 10, the neutralizer 30, the substrate holder 40, and the shutter device 50 are electrically connected to an unillustrated control device, and are controlled by the control device. Note that the side on which the neutralizer 30 is present in FIG. 1A is defined as an upper side.

The ion source 10 includes a plasma source container 20, an extraction electrode 21, a loop antenna 23, an unillustrated power supply device, an unillustrated gas introduction device, and an unillustrated electromagnet coil. The plasma source container 20 and the loop antenna are disposed in the ion source 10. The extraction electrode 21 is provided at a boundary between the ion source 10 and the vacuum container 1. The extraction electrode 21 includes multiple electrodes (not-illustrated). For example, first, second, and third electrodes are provided in this order from the ion source 10 to the substrate holder 40. A positive voltage is applied to the first electrode, and a negative voltage is applied to the second electrode. A potential difference thus generated accelerates ions extracted from the ion source 10. The third electrode is connected to the ground. The potential difference between the second electrode and the third electrode is controlled, so that the rectilinearity of the ion beam can be controlled. The loop antenna 23 receives a high-frequency power supplied from the power supply device, and generates a plasma of an etching gas in the plasma source container 20. The neutralizer 30 emits electrons into the vacuum container 1, and electrically neutralizes the ion beam emitted from the ion source 10. The gas introduction device introduces Ar gas, which is a gas for electric discharge, into the plasma source container 20. The electromagnet coil adjusts the plasma density distribution inside the ion source 10.

The substrate holder 40 includes a holding portion, a tilting device, and a rotation device (each of which is not illustrated). The holding portion holds a substrate 41 on the substrate holder 40. On the basis of a control signal from the control device (not-illustrated), the tilting device tilts the substrate holder 40 with respect to the ion source 10 about a tilt rotation axis in the vacuum container 1. The rotation device rotates the substrate 41 on the substrate holder 40 based on a control signal from a control device (not-illustrated).

The shutter device 50 has a center axis which is the same as the tilt rotation axis of the substrate holder 40, and is a double-rotation shutter including an upper shutter 51 and a lower shutter 52 whose rotations can be controlled independently from each other. The shutter device 50 is provided movably between the ion source 10 and the substrate holder 40. Each of the upper shutter 51 and the lower shutter 52 is a plate-shaped member curved in an arc shape. The shutter plates can be moved continuously from closed positions 51b and 52b to open positions 51a and 52a. The open positions 51a and 52a are positions where the shutter device 50 does not shield a beam IB emitted from the ion source 10 to the substrate holder 40, whereas the closed positions 51b and 52b are positions where the shutter device 50 shields the ion beam IB. As shown in FIG. 1C, at the open positions 51a and 52a, the upper shutter 51 and the lower shutter 52 are retracted to be away from each other at positions where the upper shutter 51 and the lower shutter 52 are not directly irradiated with the ion beam IB. At the closed positions 51b and 52b, the upper shutter 51 and the lower shutter 52 are arranged to face the ion source 10, and shields the ion beam IB traveling toward the substrate 41. As shown in FIG. 1B, the upper shutter 51 and the lower shutter 52 can move to predetermined positions 51c and 52c between the open positions 51a and 52a and the closed positions 51b and 52b to form a slit-shaped opening portion (hereinafter, referred to as slit) having a predetermined slit width W between the extraction electrode 21 and the substrate 41. The upper shutter 51 and the lower shutter 52 can be cooperated with each other, while keeping the slit width W. The slit width W of the slit 53 depends on the size of the substrate 41 and the tilt angle of the substrate 41.

Note that, for the shutter device 50, flat plate-shaped shutter plates may be used instead of the shutter plates curved in an arc shape. The shape of the shutter plates curved in an arc shape of the upper shutter 51 and the lower shutter 52 as in the case of the shutter device 50 of this embodiment is less likely to cause interference with structures in the vacuum container 1 than that of flat-plate shaped shutter plates, and does not require a space where the upper shutter 51 and the lower shutter 52 are retracted. For this reason, the size of the vacuum container 1 can be reduced. In addition, in the IBE apparatus 100 of this embodiment, the rotation axis of the shutter device 50 is the same as the tilt rotation axis of the substrate holder 40; however, these rotation axes may be away from each other, as long as these rotation axes are in parallel to each other.

Figure 2B:
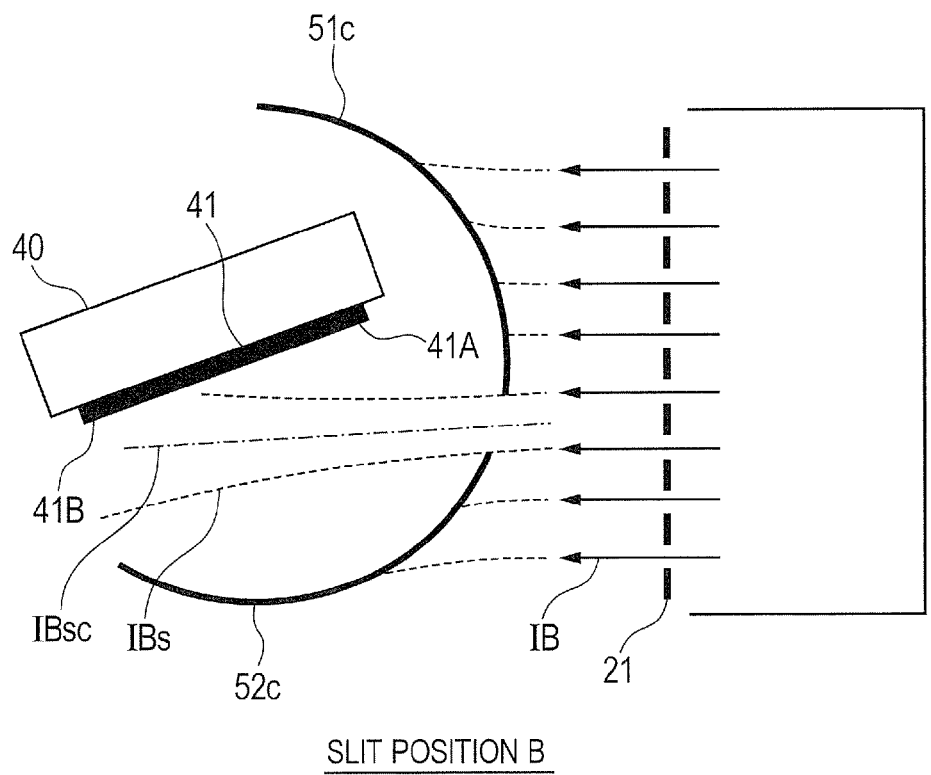

FIGS. 2A and 2B are schematic diagrams of ion beam etching processes in the IBE apparatus 100. FIG. 2A is a schematic diagram of an etching process in which the slit 53 is arranged at a position to face an upper end portion 41A of the substrate 41, and FIG. 2B is a schematic diagram of an etching process in which the slit 53 is arranged at a position to face a lower end portion 41B of the substrate 41. The ion beam IB emitted from the ion source 10 has an angle of deviation which is attributable to the plasma density distribution in the plasma source container 20. A center line IBsc at a center of the ion beam IBs passing through the slit 53 is incident on the substrate 41, while having a predetermined angle of deviation. The longer the distance from the ion source 10 to the substrate 41 is, the wider the ion beam IBs passing through the slit 53 is. In this embodiment, the substrate surface 41 is scanned with the ion beam IBs passing through the slit 53. Hence, the nonuniformity in etching amount in a substrate tilt direction can be prevented even under the low-angle-incident static condition. For example, the etching amounts of the upper end portion 41A and the lower end portion 41B of the substrate 41 can be uniform by adjusting the etching process time for each of a slit position A where the beam center of the ion beam passing through the slit 53 is incident on the upper end portion 41A of the substrate 41, and a slit position B where the beam center of the ion beam IBs passing through the slit 53 is incident on the lower end portion 41B of the substrate 41. In addition, a highly uniform etching amount can be achieved all over the surface of the substrate 41 by adjusting the etching process times at multiple positions of the substrate 41. Moreover, it is also possible to move the slit position continuously. In such a case, a highly uniform etching amount can be achieved by adjusting the moving speed of the slit 53. Details are described below. Note that it is necessary to reduce the slit width W to some degree, because a wider slit width W results in a wider region where the ion beam is incident on the substrate 41.

Figure 3A:
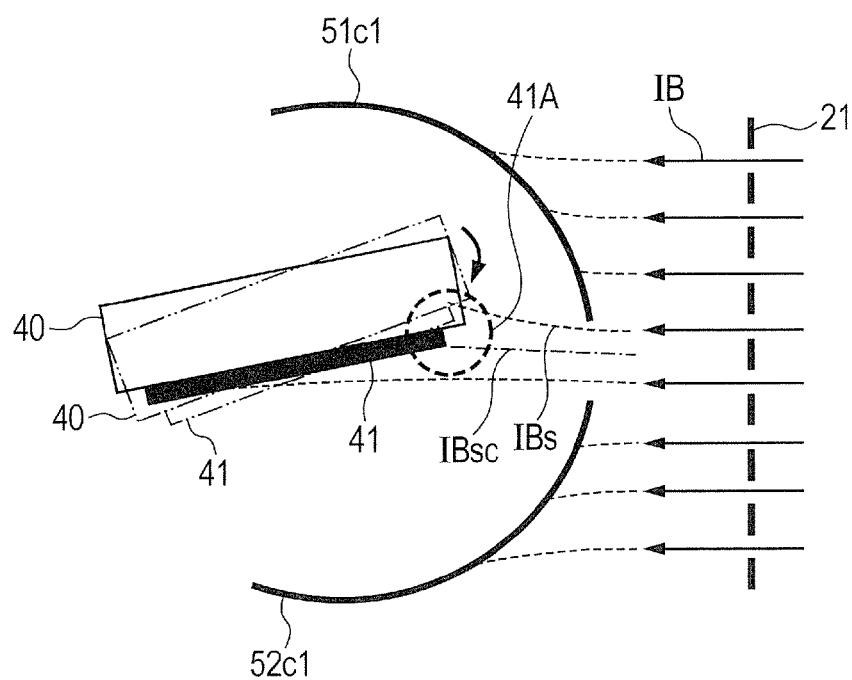
FIGS. 3A, 3B, 3C and 3D are diagrams illustrating substrate tilt angle control for adjusting an ion beam incident angle.
Figure 3B:
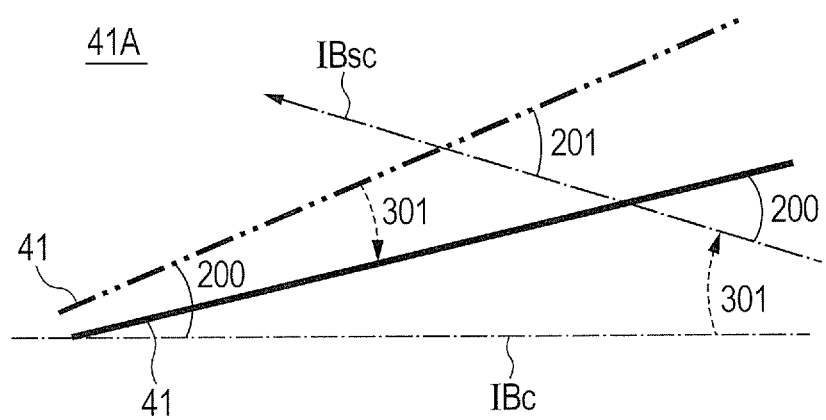
Figure 3C:
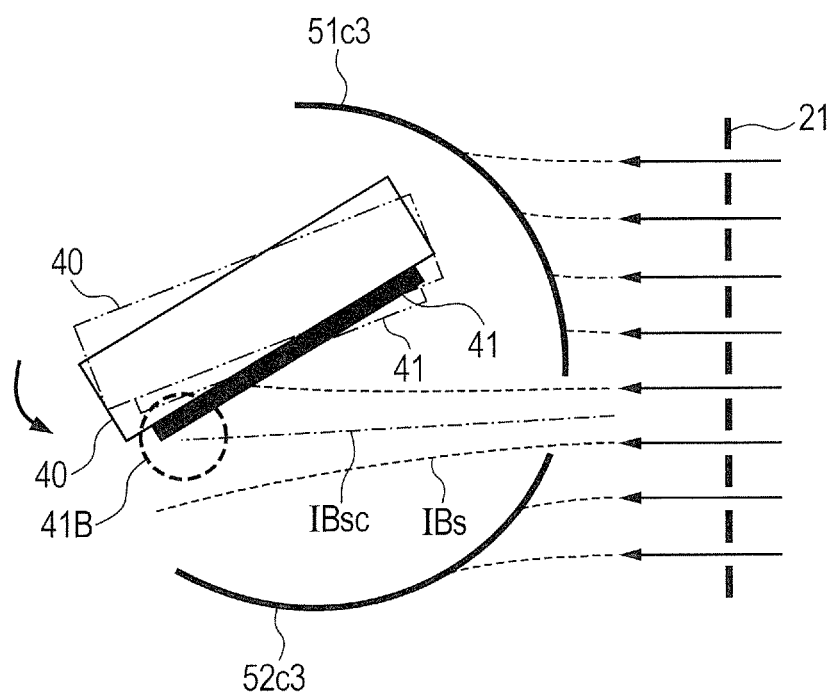
Figure 3D:
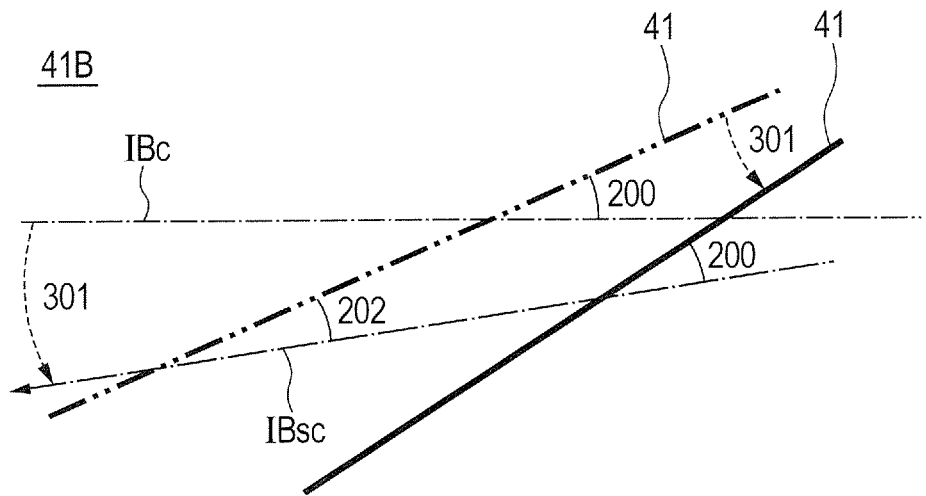

On the basis of FIGS. 3A to 3D, adjustment of a substrate tilt angle is described. FIGS. 3A to 3D are diagrams illustrating substrate tilt angle control for adjusting an ion beam incident angle. FIG. 3A is a diagram showing that the ion beam IBs is incident on the upper end portion 41A of the substrate 41, and FIG. 3B is an enlarged diagram of the upper end portion 41A of the substrate 41. FIG. 3C is a diagram showing that the ion beam IBs is incident on the lower end portion 41B of the substrate 41, and FIG. 3D is an enlarged diagram of the lower end portion 41B of the substrate 41. Two-dot chain lines in FIGS. 3A to 3D show the substrate holder 40 and the substrate 41 before the adjustment of the tilt angle of the substrate holder 40. As shown in FIGS. 3A and 3B, in the case of the upper end portion 41A of the substrate 41, the ion beam IBs is incident on the substrate 41, while having a beam center line IBsc with an angle 301 of deviation. Hence, an incident angle 201 of the beam center line IBsc on the substrate 41 before the adjustment shown by a dashed line is greater than an incident angle 200 of a straight beam IBc of the ion beam IB having no angle of deviation. As shown in FIG. 3B, the tilt angle of the substrate holder 40 is moved downward in the figure by the beam angle 301 of deviation, to reduce the difference between the incident angles. In this manner, the incident angle on the substrate 41 after the adjustment shown by a solid line is the incident angle 200, which is equal to that of the straight beam IBc.

In the case of the lower end portion 41B of the substrate 41, the angles of deviation of the ion beam are vertically inverted from those in the case of the upper end portion 41A, as shown in FIGS. 3C and 3D. Hence, an incident angle 202 of the beam center line IBsc on the substrate 41 before the adjustment shown by the two-dot chain line is smaller than the incident angle 200 of the straight beam IBc. As shown in FIG. 3D, the substrate holder 40 is moved downwardly in the figure by the angle 301 of deviation. Thus, the incident angle on the substrate 41 after the adjustment shown by a solid line is the incident angle 200, which is equal to that of the straight beam IBc. The adjustment of the tilt angle of the substrate holder 40 as shown in FIGS. 3A and 3C changes the tilt angle of the substrate 41 from the position at which the substrate 41 is placed face to face with the ion source 10 as follows. Specifically, the tilt angle in the case where the ion beam IBs is incident on the lower end portion 41B becomes smaller than the tilt angle in the case where the ion beam IBs is incident on the upper end portion 41A of the substrate 41. In other words, as the position at which the ion beam center line IBsc is incident on the substrate 41 gets more distant from the ion source 10, the tilt angle of the substrate 41 gets smaller. When the tilt angle of the substrate 41 is adjusted in opposite directions on the upper side and the lower side of the center of the substrate 41 as described above, the incident angle of the beam center line IBsc on the substrate 41 can be made constant between the upper end portion 41A and the lower end portion 41B of the substrate 41.

The ion beam IB is a collection of positive ions. Hence, the ion beam IB is spread outwardly in the traveling direction. Accordingly, the angle of deviation increases from the center to the outer periphery of the ion beam IBs. Moreover, the angle of deviation increases with increase in distance from the ion source 10. In other words, the ion beam IB has a different beam angle of deviation depending on the distance between the extraction electrode 21 and the substrate 41. Note that, the neutralization of the ion beam IB is not achieved by collision of the positive ions emitted from the ion source 10 with electrons in the vapor phase. Hence, the phenomenon that the ion beam IB spreads outwardly in the traveling direction occurs even when electrons are supplied from the neutralizer 30.

Figure 4A:
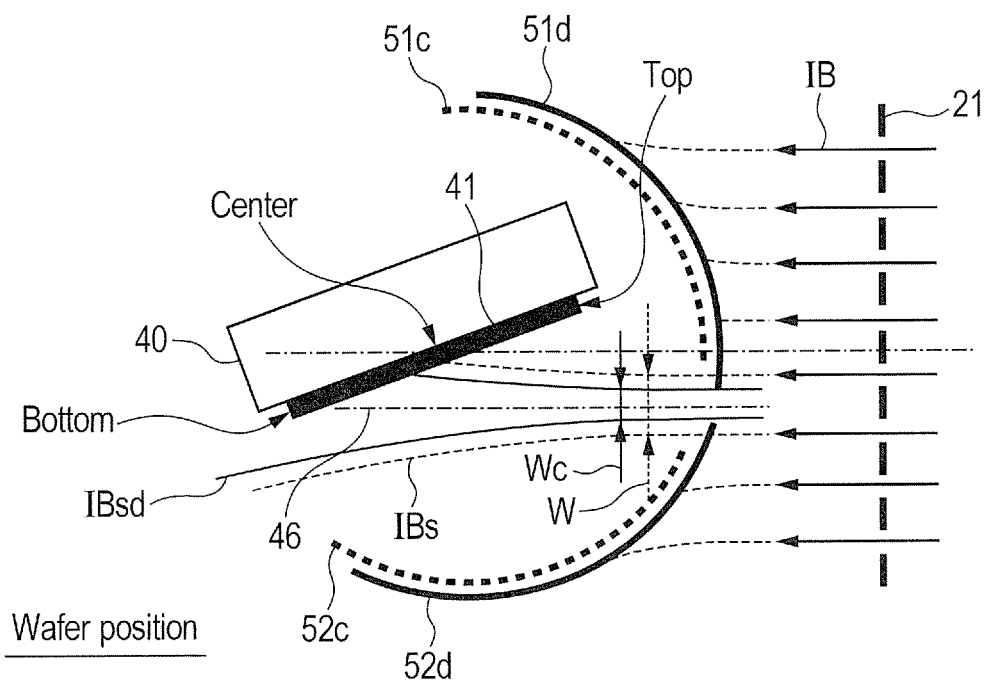
FIGS. 4A and 4B are a diagram and a graph illustrating shutter control for adjusting an ion beam dispersion.
Figure 4B:
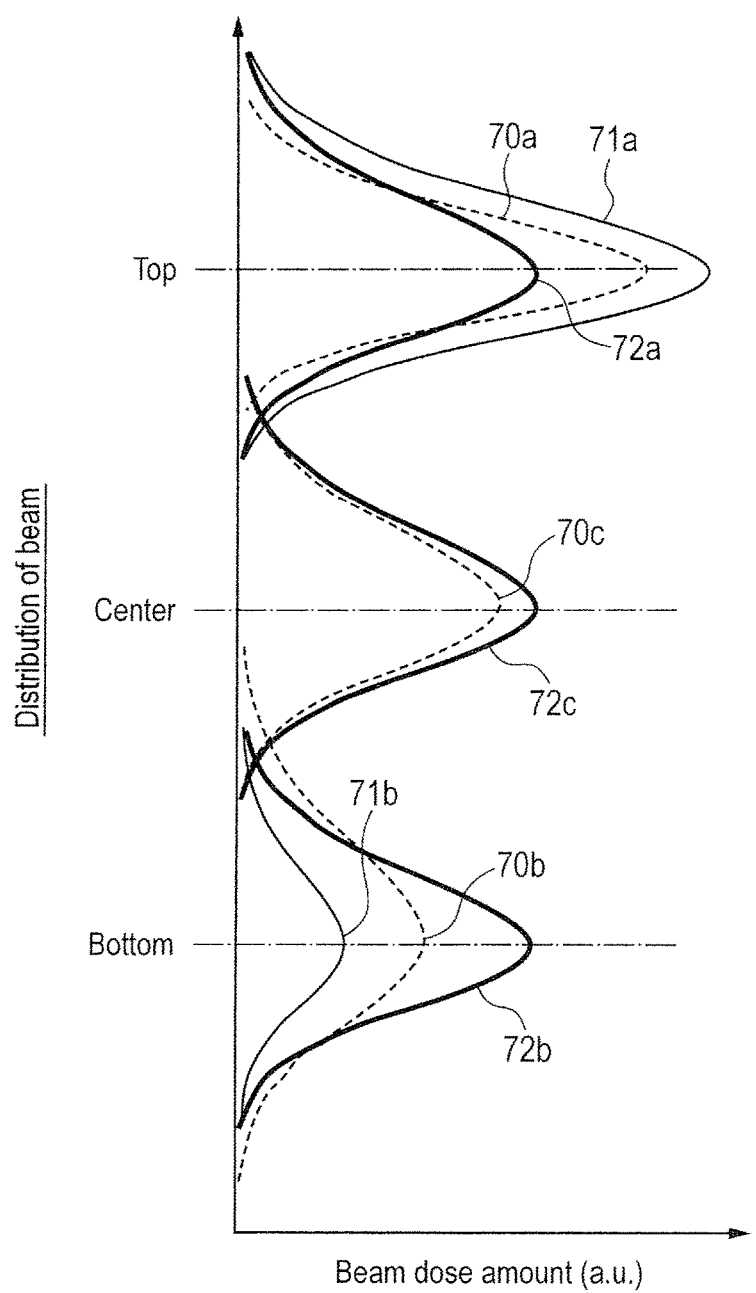

On the basis of FIGS. 4A and 4B, the adjustment of the slit width W is described. FIGS. 4A and 4B are a diagram and a graph illustrating shutter control for adjusting ion beam dispersion. FIG. 4A is a schematic diagram in which the slit 53 is arranged at the lower end portion 41B of the substrate 41. FIG. 4B shows the degrees of dispersion of the ion beam IBs passing through the slit 53 on the substrate 41 in the form of dispersion curves. The ion beam IB emitted from the extraction electrode 21 passes through the slit 53 formed by the upper shutter 51 and the lower shutter 52 at the positions 51c and 52c, and is incident on the substrate 41 as the ion beam IBs. The positions 51d and 52d are positions of the upper shutter 51 and the lower shutter 52 after the slit width adjustment, and a slit width Wc is a slit width after the adjustment. An average incident angle of the ion beam IBsd passing through the slit after the adjustment is smaller than an average incident angle of the ion beam IBs passing through the slit before the adjustment. Note that a slit center line 46 represents a straight line passing through a center position of the slit widths W and Wc in the width direction.

FIG. 4B shows the degree of dispersion of the ion beam incident angle on the substrate 41 under the low-angle-incident static condition at each of the upper end portion (Top), a center portion (Center), and the lower end portion (Bottom) of the substrate 41 in the corresponding one of the cases where the slit width W is formed in such a manner that the slit center line 46 can pass through the upper end portion (Top), the center portion (Center), or the lower end portion (Bottom) of the substrate 41. Note that, for simplification, the angle of deviation of the ion beam is not taken into account. In FIG. 4B, the vertical axis represents the dispersion width, and the horizontal axis represents the dose of the ion beam per unit time. The maximum value of each dispersion curve corresponds to the center of the straight beam. Dispersion curves 70a, 70b, and 70c show the dispersions at the positions before the adjustment of the slit width W, where the slit positions are set at the substrate upper end portion a, the substrate center portion c, and the substrate lower end portion b, respectively. The dispersion of the ion beam IBs increases depending on the distance from the extraction electrode 21. Hence, the widths of the dispersion curves 70a to 70c of the incident angle increase and the maximum values thereof decreases from the upper end portion to the lower end portion of the substrate 41. In other words, since the width of the ion beam IBs is larger at the lower end portion of the substrate 41 than at the upper end portion, the width of the dispersion curve 70b is larger than the width of the dispersion curve 70a. In addition, since the amounts of the incident ion beam are constant among these positions, the ion beam dispersion is broader at the lower end portion than at the upper end portion. Hence, the dispersion curve 70b of the lower end portion has a smaller maximum value than the dispersion curve 70a of the upper end portion. For this reason, the etching amount is nonuniform in the substrate 41. As a solution to this problem, the slit width is adjusted wider for the upper end portion of the substrate 41 and narrower for the lower end portion of the substrate 41 than the slit width of the center portion of the substrate 41. Thus, the widths of the dispersion curves can be uniform among the positions, as shown in the dispersion curves 71a and 71b at these positions.

The dispersion curves 70c, 71a, and 71b have the same dispersion curve width, but have different maximum values. When the maximum values are different, the resultant etching amounts are not uniform. In this respect, to adjust the difference in the amount of the ion beam incident on the substrate 41, an etching process time is adjusted. Specifically, the etching process time for the lower end portion more distant from the ion source 10 is made longer than the etching process time for the upper end portion. This makes it possible to obtain dispersion curves 72a, 72b, and 72c, which are uniform among the positions. In addition, the same amount of the ion beam as that at the upper end portion near the ion source 10 can be obtained also at the lower end portion distant from the ion source 10. The slit width W and the etching time are increased or decreased on the upper side and the lower side of the center portion of the substrate 41 as described above. In this manner, the incident angle of the ion beam and the accumulated incident amount of the ion beam can be made uniform among the positions of the substrate 41.

Figure 5:
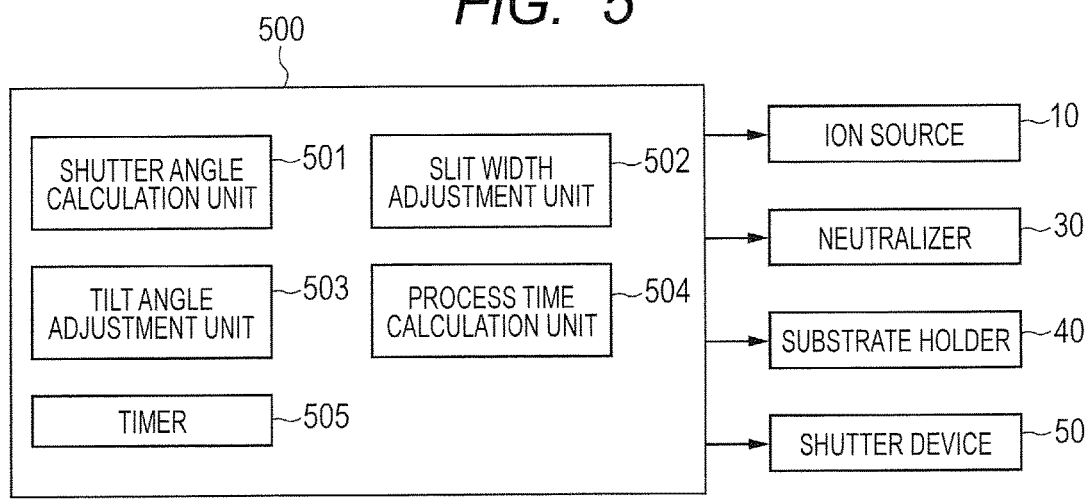
FIG. 5 is a schematic diagram of a control device of the ion beam etching apparatus according to the embodiment of the present invention.

FIG. 5 is a schematic diagram of a control device 500 provided in the IBE apparatus 100 according to the embodiment of the present invention. The control device 500, which serves as a position control unit, an etching control unit, and a tilt angle control unit, includes CPU and a memory (not-illustrated) such as RAM or ROM. The memory stores programs executed by the CPU and the like. The control device 500 executes ion beam etching by executing a predetermined program stored in the memory or according to instruction signals from a higher-level apparatus. The control device 500 includes a shutter angle calculation unit 501, a slit width adjustment unit 502, a tilt angle adjustment unit 503, a process time calculation unit 504, and a timer 505. The shutter angle calculation unit 501 calculates shutter angles of the upper shutter 51 and the lower shutter 52. Note that an upper shutter angle and a lower shutter angle are angles with respect to a reference position. For example, the upper shutter angle and the lower shutter angle may be angles with respect to the open positions 51a and 52a of the upper shutter 51 and the lower shutter 52, or may be angles with respect to the center position of the extraction electrode 21. The slit width adjustment unit 502 adjusts the slit width W according to the position of the slit 53 with respect to the substrate 41. The tilt angle adjustment unit 503 adjusts the substrate tilt angle according to the position of the slit 53 with respect to the substrate 41. The process time calculation unit 504 calculates the etching process time according to the position of the slit 53 with respect to the substrate 41. The timer 505 counts the etching time calculated by the process time calculation unit 504. The control device 500 controls the emission and stop of the ion beam from the ion source 10 and the emission and stop of the electrons from the neutralizer 30, according to the count of the timer 505. The control device 500 is electrically connected to the ion source 10, the neutralizer 30, the substrate holder 40, and the shutter device 50. The ion source 10, the neutralizer 30, the substrate holder 40, and the shutter device 50 operate on the basis of parameters outputted from the control device 500.

Figure 6A:
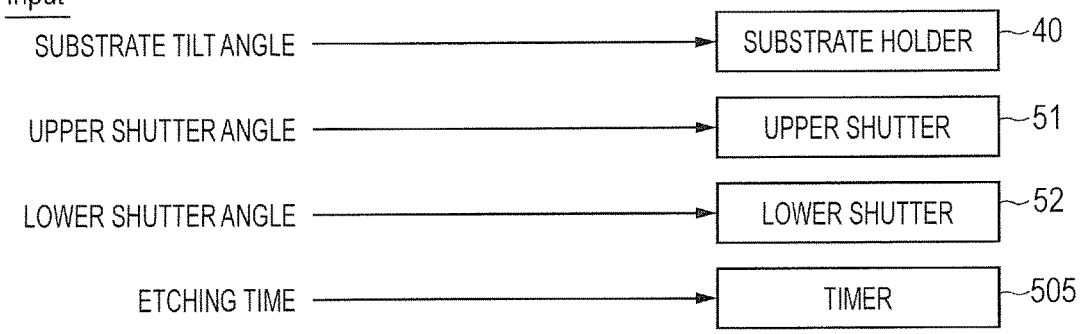
FIGS. 6A, 6B and 6C are diagrams showing control of the ion beam etching apparatus according to the embodiment of the present invention.
Figure 6B:
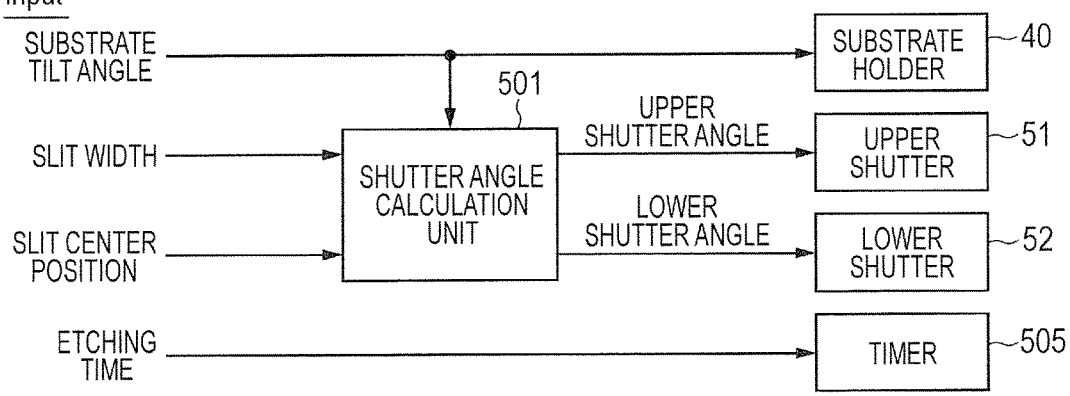
Figure 6C:
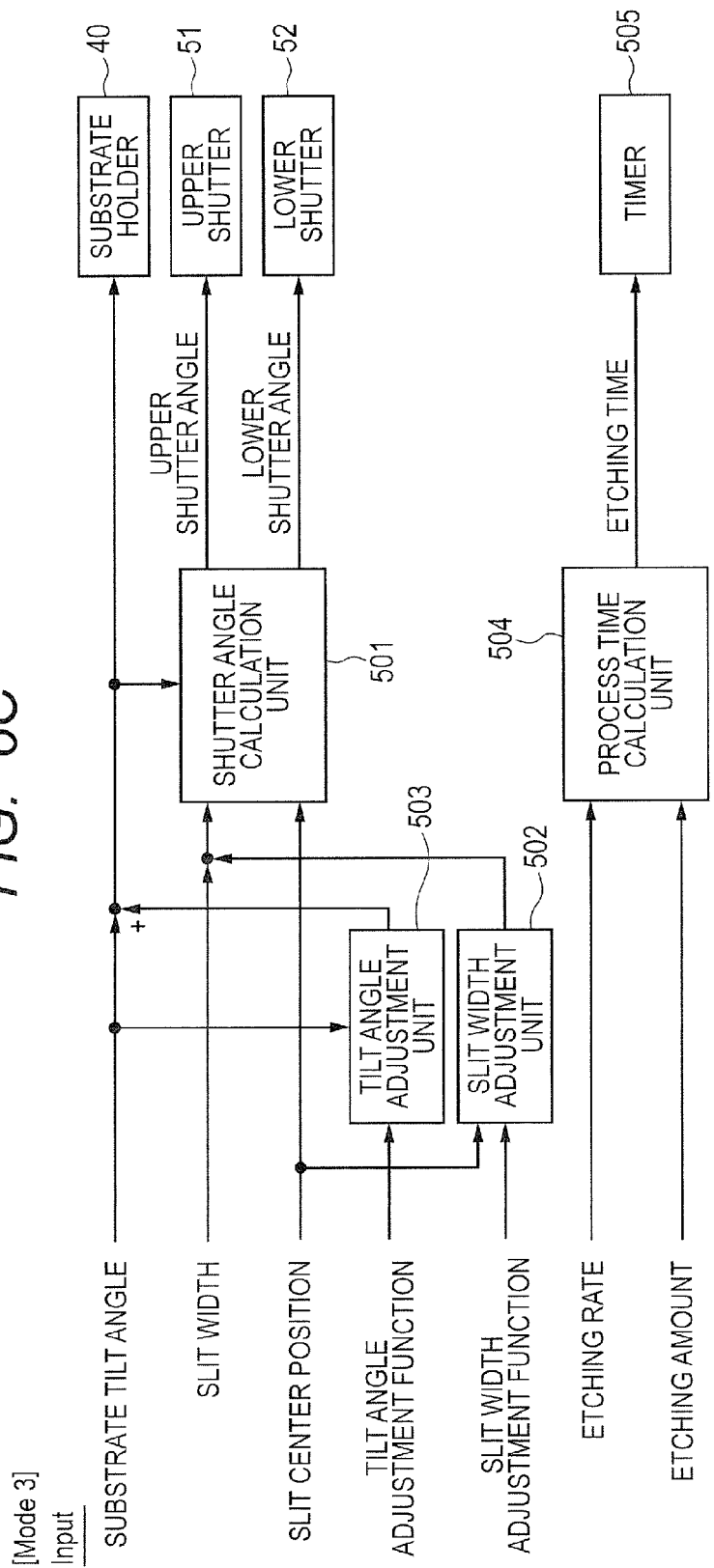

A method for controlling a shutter scan mode according to this embodiment is described based on FIGS. 6A to 6C. FIGS. 6A to 6C are diagrams showing control of the IBE apparatus 100. FIG. 6A is a diagram showing that the devices are controlled by directly inputting parameters. FIG. 6B is a diagram showing that the IBE apparatus 100 is controlled by using the shutter angle calculation unit 501. FIG. 6C is a diagram showing that the IBE apparatus 100 according to the embodiment of the present invention is controlled. In FIGS. 6A to 6C, control for a single slit position is described. However, when the entire surface of the substrate 41 is processed, the same control is repeated at multiple slit positions. This control method has three modes, which depend on what parameters are inputted. Note that the shutter scan refers to the determination of the position at which the slit 53 is formed by using the shutter device 50.

As shown in FIG. 6A, in a first mode, the substrate tilt angle, the upper shutter angle, the lower shutter angle, and the etching time are directly inputted to operate the substrate holder 40, the shutter device 50, and the timer 505. In mode 1, the distribution of the etching can be improved.

As shown in FIG. 6B, in a second mode, the substrate tilt angle, the slit width, the slit position, and the etching time are inputted, and the shutter angle calculation unit 501 calculates the shutter angles on the basis of the slit width and the slit center position to operate the substrate holder 40, the shutter device 50, and the timer 505. This mode is used to control the shutter scan mode according to the embodiment of the present invention.

As shown in FIG. 6C, a third mode includes the adjustment of the slit width W of the shutter device 50, in addition to the shutter scan mode. Specifically, the third mode is the second mode to which a tilt angle adjustment function, a slit width adjustment function, an etching rate, and an etching amount are added, which are adjustment parameters for obtaining elements with uniform shapes in the surface of the substrate 41. The substrate tilt angle adjustment function is stored in an unillustrated memory. In this function, the adjustment amount of the substrate tilt angle is determined as a predetermined function f(x), where the variable x is the distance from the extraction electrode 21 to the substrate surface 41. The control device 500 operates the substrate holder 40 on the basis of the tilt angle adjustment amount and the substrate tilt angle calculated by the tilt angle adjustment unit 503. In addition, the shutter angle calculation unit 501 calculates the upper shutter angle and the lower shutter angle on the basis of the adjusted substrate tilt angle, the slit width W, and the slit center position. The slit width adjustment function is stored in an unillustrated memory. The adjustment amount of the slit width W is determined as any function g(x), where the variable x is the distance from the extraction electrode 21 to the substrate surface 41. The shutter angle calculation unit 501 uses a value obtained by adding the adjustment amount calculated by the slit width adjustment unit 502 to the slit width W. In addition, since the adjustment amount of the substrate tilt angle and the adjustment amount of the slit width vary depending on the beam conditions (acceleration voltage, beam current, and the like), multiple tilt angle adjustment functions and multiple slit width adjustment functions can be stored in the memory, and the control device 500 can switch one tilt angle adjustment function to another and one slit width adjustment function to another, if necessary. The process time calculation unit 504 calculates the etching time on the basis of the etching rate and the etching amount. Thus, the control device 500 controls the substrate holder 40 based on the adjusted substrate tilt angle, and controls the upper shutter and the lower shutter based on the adjusted shutter angles.

Figure 7:
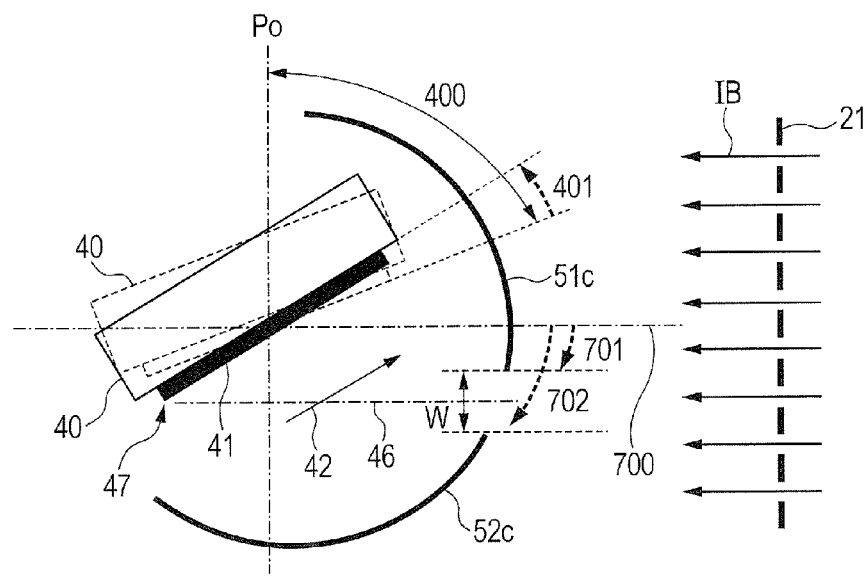
FIG. 7 is a diagram illustrating a method for controlling the ion beam etching apparatus according to the embodiment of the present invention.

FIG. 7 is a diagram illustrating a method for controlling the IBE apparatus 100 according to this embodiment. Input parameters of the shutter scan mode according to this embodiment are described based on FIG. 7. Four basic input parameters of the shutter scan mode are a substrate tilt angle 400 of the substrate 41, the slit width W, a slit center position 47, and the etching time. The substrate tilt angle 400 is the tilt angle of the substrate 41 with respect to an initial position of the substrate 41. The initial position is, for example, a position $P_0$ at which the substrate 41 is placed face to face with the ion source 10. In addition, two adjustment parameters for making the incident angles of the ion beam IB on the substrate 41 uniform are an adjustment angle 401 and the slit width (not-illustrated). The adjustment angle 401 is outputted from the tilt angle adjustment unit 503 (FIG. 6C), and the adjusted tilt angle of the substrate 41 is calculated by adding the adjustment angle 401 to the substrate tilt angle 400.

The slit center position 47 is a position on the surface of the substrate in a substrate tilt direction 42. In other words, the slit center position 47 is a position of the slit center line 46 of the slit 53 on the surface of the substrate 41. As shown in FIGS. 6B and 6C, the shutter angles of the upper shutter 51 and the lower shutter 52 are calculated from the substrate tilt angle 400, the slit width W, and the slit center position 47. The upper shutter 51 and the lower shutter 52 are located at the positions 51c and 52c achieved by rotating the upper shutter 51 by a shutter angle 701 and rotating the lower shutter 52 by a shutter angle 702. Here, a center line 700 of the extraction electrode 21 of the substrate 41 is taken as an origin.

When the slit width W is too large, the effect of the shutter scan decreases. When the slit width W is too small, the etching rate decreases. For this reason, the slit width W is preferably about R cos (the substrate tilt angle 400), where R is the height in the substrate tilt direction 42 of the substrate 41 viewed from the extraction electrode 21, i.e., the diameter of the substrate 41.

Figure 8:
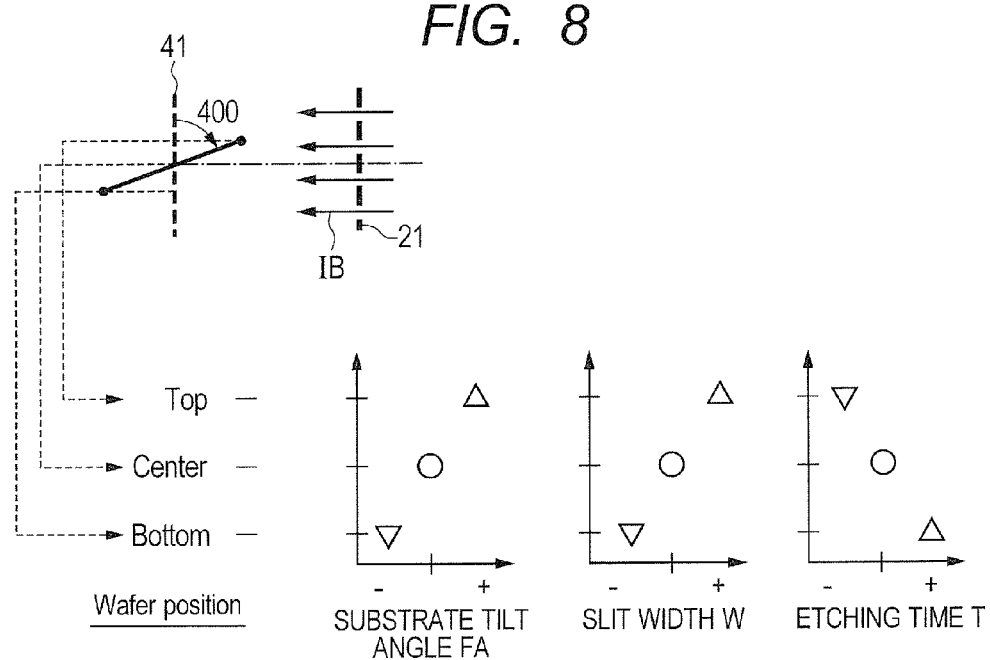
FIG. 8 is a diagram illustrating the method for controlling the ion beam etching apparatus according to the embodiment of the present invention.

Setting values of the parameters are described based on FIG. 8. FIG. 8 is a diagram illustrating the method for controlling the IBE apparatus 100 according to this embodiment. FIG. 8 shows increases or decreases of the parameters in a height direction of the substrate 41 with reference to those at the substrate center. Here, the slit is formed at three positions, namely, the substrate center, the upper side (upper end), and the lower side (lower end) of the substrate. To adjust the ion beam incident angle on the substrate surface 41, the substrate tilt angle FA is increased (Δ) for etching the upper side of the substrate and decreased (∇) for etching the lower side of the substrate 41, with respect to the substrate tilt angle (○) at the center position of the substrate 41. Note that the adjustment amount of the substrate tilt angle is less than several degrees, although it varies depending on the angle of deviation and the dispersion of the incident ion beam. The adjusted substrate tilt angle FA is an angle tilted from the position at which the substrate 41 is placed face to face with the extraction electrode 21. Accordingly, the tilt angle of the substrate 41 is larger on the upper side of the substrate 41, which is closer to the ion source 10, but is smaller on the lower side of the substrate 41, which is more distant from the ion source 10, than the tilt angle of the substrate 41 at the center position. To adjust the dispersion of the ion beam on the substrate surface 41, the slit width W is increased (Δ) for etching the upper side of the substrate 41, but decreased (∇) for etching the lower side of the substrate 41, with respect to the slit width (○) for the center position of the substrate 41. The etching time T is shortened (∇) for etching the upper side of the substrate 41, but elongated (Δ) for etching the lower side of the substrate 41, although it varies depending on setting values of other parameters. The increase and decrease amounts are determined based on the actual nonuniformity of the etching amount. Note that the slit positions are not limited to positions within the substrate surface, but can be set outside the substrate surface. The number of the slit positions is not limited to three, but can be increased or decreased, if necessary.

Figure 9A:
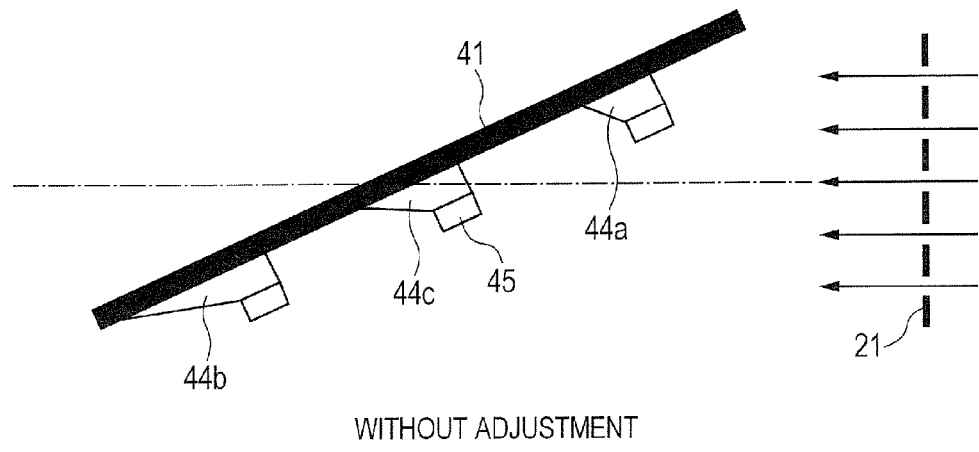
FIGS. 9A and 9B are diagrams showing shapes of elements after etching.
Figure 9B:
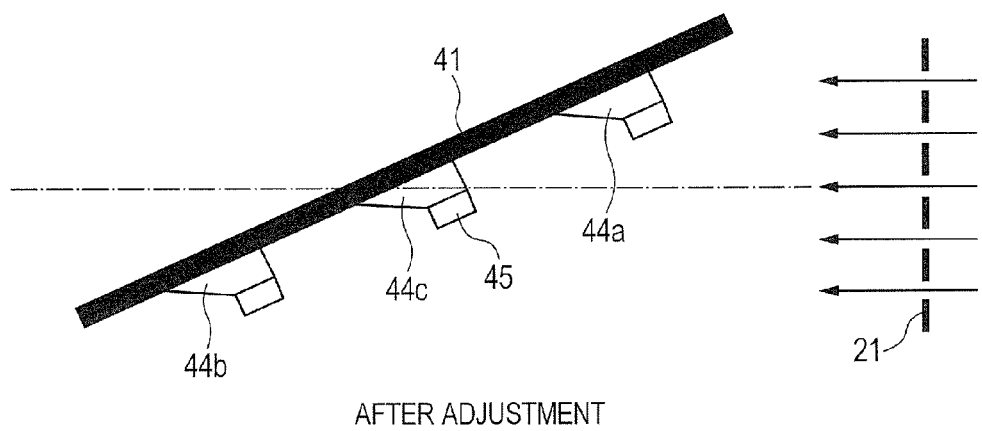

FIGS. 9A and 9B are diagrams showing shapes of elements after etching. FIG. 9A shows shapes of elements obtained in a case where the substrate 41 is subjected to etching process without adjustment of any of the substrate tilt angle FA, the slit width W, and the etching time T. FIG. 9B shows shapes of elements obtained in a case where the substrate 41 is subjected to etching process, with the substrate tilt angle FA, the slit width W, and the etching time T being adjusted. Note that the substrate holder 40 and the shutter device 50 are omitted in FIGS. 9A and 9B. When the etching process is performed without adjustment of any one of the substrate tilt angle FA, the slit width W, and the etching time T, the shapes of elements 44a to 44c formed on the substrate 41 on which a resist 45 is provided are as follows. Specifically, the length of a side surface on one side of the element 44a on the upper side of the substrate 41 is shorter and the length of a side surface on the one side of the element 44b on the lower side of the substrate 41 is longer than that of the shape of the element 44c formed at a substantially center of the substrate 41. Thus, the shapes of the elements are non-uniform. On the other hand, when the etching process is performed with each of the substrate tilt angle FA, the slit width W, and the etching time T being adjusted, the incident angles of the beam on the substrate 41 on the upper side and the lower side can be uniform, so that the shapes of the elements 44a to 44c can be highly uniform.

In this embodiment, the tilt angle 400 of the substrate 41 is reduced as the incident position of the center line IBsc of the ion beam IBs passing through the slit 53 moves away from the ion source 10, as described above. This enables the incident angles of the ion beam center line IBsc on the upper end portion and the lower end portion of the substrate 41 to be uniform, so that elements with highly uniform shapes can be obtained.

Example

Figure 10A:
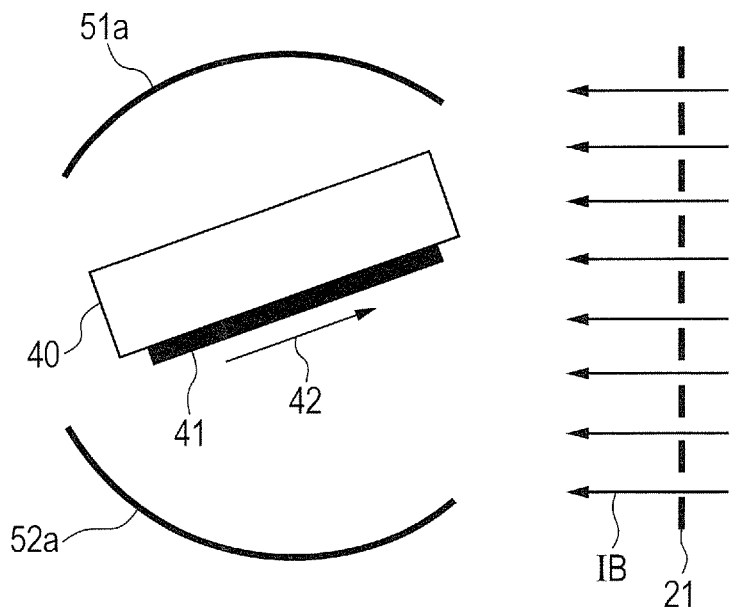
FIGS. 10A and 10B are schematic diagrams of ion beam etching using the ion beam etching apparatus according to the embodiment of the present invention.
Figure 10B:
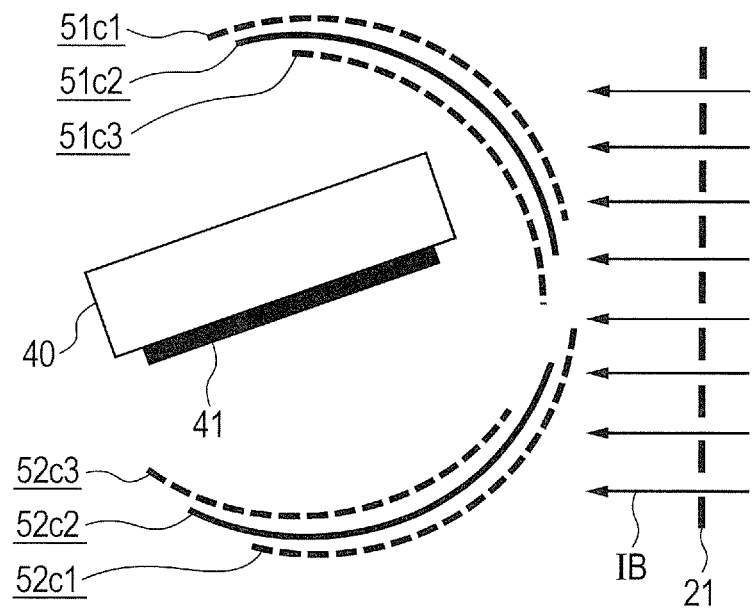

Example of ion beam etching using the shutter device 50 is described. FIGS. 10A and 10B are schematic diagrams of ion beam etching using the IBE apparatus 100. FIG. 10A shows an arrangement of the upper shutter 51 and the lower shutter 52 in a state where the upper shutter 51 and the lower shutter 52 are positioned at the open positions 51a and 52a and do not perform the shutter scan. FIG. 10B shows an arrangement of the upper shutter 51 and the lower shutter 52 in a state where the shutter scan is being performed in which the upper shutter 51 and the lower shutter 52 approach each other, and the slit 53 is formed at multiple positions. In FIG. 10A, the substrate tilt direction 42 is a direction approaching the ion source 10.

Figure 11A:
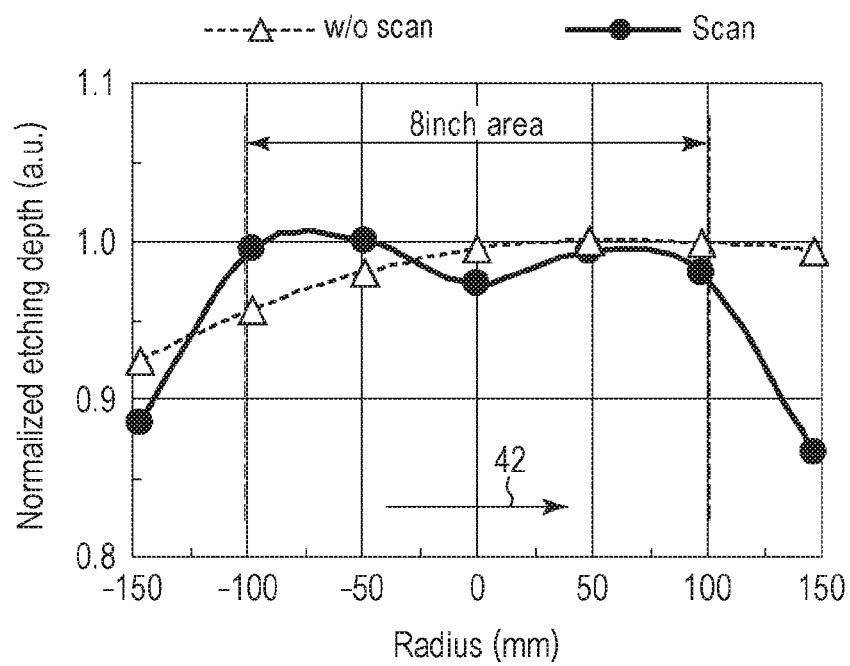
FIGS. 11A and 11B are diagrams showing an etching distribution achieved by using the ion beam etching apparatus according to the embodiment of the present invention.
Figure 11B:
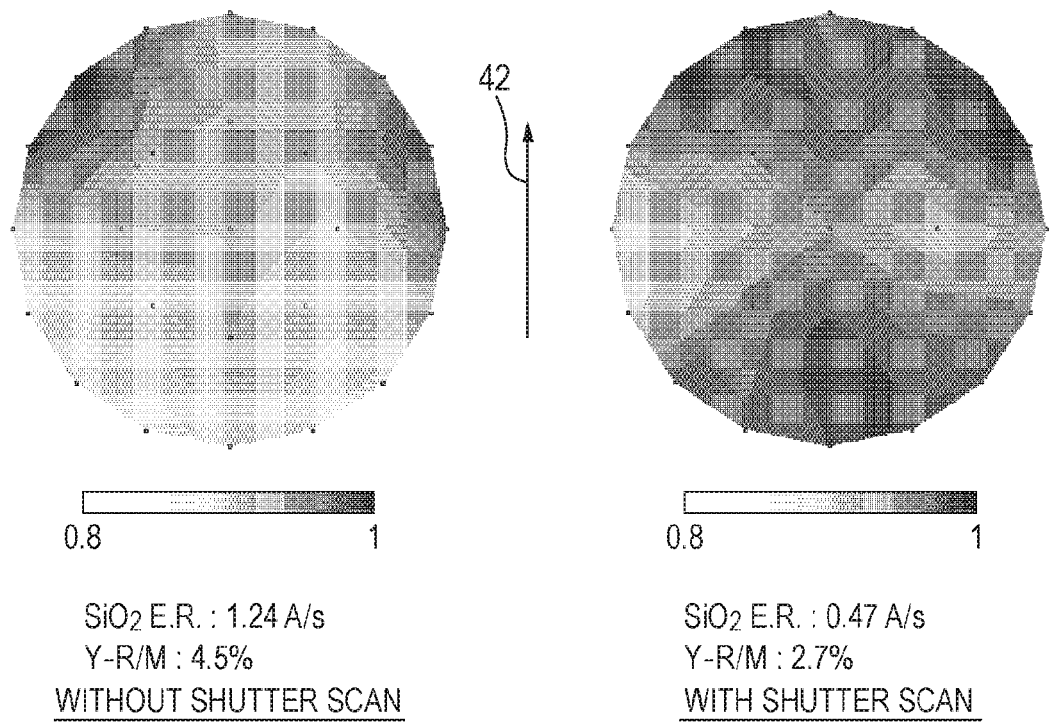

FIGS. 11A and 11B are a graph and a diagram showing distributions of etching using ion beam. FIG. 11A is a graph showing profiles of normalized ion beam etching amounts, and FIG. 11B is a diagram showing distributions of normalized etching amounts. In FIG. 11A, a comparison is made between contour maps of normalized etching rate within the surface of the substrate 41 obtained with or without the shutter scan and between profiles of normalized etching rate in the substrate tilt direction 42. The measurement conditions of FIG. 11A were that the acceleration voltage of the ion beam IB was 200 V, and the ion beam IB was incident at a substrate tilt angle of 70° (an incident angle of 20° on the substrate surface 41). In FIG. 11A, ● indicates a profile obtained with the shutter scan, and Δ indicates a profile without the shutter scan. The arrangement of the upper shutter 51 and the lower shutter in the case where the shutter scan was used was such that the slit width W was 50 mm, and the slit center was adjusted to three positions, namely, an upper end portion, a center portion, and a lower end portion of the substrate 41. In addition, the etching time at each position was adjusted. Note that the three positions at which the upper shutter 51 and the lower shutter 52 were stopped were referred to as c1, c2, and c3.

As shown in FIG. 11B, as a result of the application of the shutter scan, the nonuniformity in etching amount in the substrate tilt direction 42 was successfully eliminated. In this Example, a highly uniform etching process was achieved as etching in a surface of an 8-inch substrate; however, this is also effective for a larger substrate by adjusting the slit position and the etching process time. In addition, when the apparatus having the double-rotation shutter shown in FIGS. 1A to 1C is used, the upper shutter 51 and the lower shutter 52 can be set at open positions to obtain a high etching rate with an acceleration voltage of 400 V or higher. In other words, the shutter scan mode enables selection between conditions where the uniformity of the etching amount is considered to be important and conditions where the etching rate is considered to be important by adjusting the positions of the two shutters.

EXPLANATION OF THE REFERENCE NUMERALS 1 vacuum container
10 ion source
21 extraction electrode
40 substrate holder
41 substrate
47 slit center position
50 shutter device
51 upper shutter
52 lower shutter
53 slit (opening portion)
100 ion beam etching apparatus
400 substrate tilt angle
401 adjustment angle
500 control device
IB ion beam

The invention claimed is:

1. An ion beam etching method performed in an ion beam etching apparatus including an ion source that emits an ion beam to a substrate, a substrate holder that holds the substrate and changes a tilt angle of the substrate with respect to a position at which the substrate is face to face with the ion source, and a shutter that has an opening portion through which the ion beam passes and is capable of changing a position of the opening portion with respect to the substrate, the ion beam etching method comprising:
   holding the substrate so that the tilt angle becomes smaller as a distance is increased between the ion source and a center of a site where the ion beam passed through the opening portion is incident on the substrate; and
   etching the substrate with the ion beam passing through the opening portion.

2. The ion beam etching method according to claim 1, wherein an etching time is made longer as the distance between the ion source and the center of the site is increased.

3. The ion beam etching method according to claim 1, wherein the substrate is etched with the changing the position of the opening portion with respect to the substrate.

4. An ion beam etching apparatus, comprising:
   an ion source that emits an ion beam to a substrate;

a substrate holder that holds the substrate and changes a tilt angle of the substrate with respect to a position at which the substrate is face to face with the ion source;

a shutter that has an opening portion through which the ion beam passes and is capable of changing a position of the opening portion with respect to the substrate; and a tilt angle control unit that controls the tilt angle so that it becomes smaller as a distance is increased between the ion source and a center of a site where the ion beam passed through the opening portion is incident on the substrate.

5. The ion beam etching apparatus according to claim 4, further comprising an etching control unit that controls etching so that an etching time is made longer as the distance is increased between the ion source and the center of the site.

* * * * *